(12) United States Patent
Giraldo et al.

(10) Patent No.: US 10,615,376 B2
(45) Date of Patent: Apr. 7, 2020

(54) ENCAPSULATION STRUCTURE FOR AN OLED DISPLAY INCORPORATING ANTIREFLECTION PROPERTIES

(71) Applicant: BASF COATINGS GMBH, Münster (DE)

(72) Inventors: Andrea Giraldo, Riehen (CH); Qian Tang, Oberwil (CH); Richard Frantz, Village-Neuf (FR); Emmanuel Martin, Folgensbourg (FR)

(73) Assignee: BASF COATINGS GMBH, Muenster (DE)

( * ) Notice: Subject to any disclaimer, the term of this patent is extended or adjusted under 35 U.S.C. 154(b) by 0 days.

(21) Appl. No.: 15/325,304

(22) PCT Filed: Jul. 29, 2015

(86) PCT No.: PCT/EP2015/067097
§ 371 (c)(1),
(2) Date: Jan. 10, 2017

(87) PCT Pub. No.: WO2016/016156
PCT Pub. Date: Feb. 4, 2016

(65) Prior Publication Data
US 2017/0187004 A1   Jun. 29, 2017

(30) Foreign Application Priority Data

Jul. 31, 2014 (EP) ..................... 14179250

(51) Int. Cl.
*H01L 51/52* (2006.01)
*H01L 51/00* (2006.01)
(Continued)

(52) U.S. Cl.
CPC ........ *H01L 51/5281* (2013.01); *G02B 5/3016* (2013.01); *G02B 5/3033* (2013.01);
(Continued)

(58) Field of Classification Search
CPC ............. H01L 51/5281; H01L 51/5253; H01L 51/5259; H01L 51/56; H01L 51/003; G02B 5/3016
See application file for complete search history.

(56) References Cited

U.S. PATENT DOCUMENTS

| | | |
|---|---|---|
| 4,122,027 A | 10/1978 | Cole, Jr. et al. |
| 4,401,369 A | 8/1983 | Jones |

(Continued)

FOREIGN PATENT DOCUMENTS

| | | |
|---|---|---|
| EP | 0 397 263 A1 | 11/1990 |
| EP | 2 557 102 A1 | 2/2013 |

(Continued)

OTHER PUBLICATIONS

Giovanni Nisato, et al., "Experimental comparison of high-performance water vapor permeation measurement methods", Organic Electronics, 2014, pp. 3746-3755, vol. 15.

(Continued)

*Primary Examiner* — Matthew E. Gordon
(74) *Attorney, Agent, or Firm* — Armstrong Teasdale LLP

(57) ABSTRACT

The invention relates to encapsulation structures for OLED displays, wherein the structure provides sufficient barrier properties against oxygen and moisture as well as anti-reflection properties. The structure includes a layer comprising a photo-aligned substance which in a synergistic manner controls both barrier and anti-reflection properties.

43 Claims, 8 Drawing Sheets

(51) Int. Cl.
*G02B 5/30* (2006.01)
*H01L 51/56* (2006.01)

(52) U.S. Cl.
CPC ........ *H01L 51/003* (2013.01); *H01L 51/5253* (2013.01); *H01L 51/5259* (2013.01); *H01L 51/56* (2013.01); *H01L 2251/558* (2013.01)

(56) References Cited

U.S. PATENT DOCUMENTS

| | | | |
|---|---|---|---|
| 4,565,424 A | 1/1986 | Huffman et al. | |
| 4,667,020 A | 5/1987 | Etzbach et al. | |
| 5,024,850 A * | 6/1991 | Broer ................ | C09K 19/38 349/183 |
| 5,389,285 A | 2/1995 | Shannon et al. | |
| 5,539,074 A | 7/1996 | Herr et al. | |
| 6,107,427 A | 8/2000 | Herr et al. | |
| 6,201,087 B1 | 3/2001 | Herr et al. | |
| 6,632,909 B2 | 10/2003 | Buchecker et al. | |
| 6,717,644 B2 | 4/2004 | Schadt et al. | |
| 7,959,990 B2 | 6/2011 | Cherkaoui et al. | |
| 2005/0068406 A1* | 3/2005 | Koyama ............... | B41J 2/33545 347/203 |
| 2007/0098921 A1* | 5/2007 | Liang ................... | C08G 77/38 428/1.5 |
| 2008/0200332 A1* | 8/2008 | Giannantonio ...... | B01J 20/0222 502/402 |
| 2008/0274304 A1* | 11/2008 | Cherkaoui ............ | C09K 19/56 428/1.2 |
| 2011/0199565 A1* | 8/2011 | Kunimatsu ....... | G02F 1/133723 349/123 |
| 2013/0025502 A1* | 1/2013 | Hatanaka ............ | C08G 18/6216 106/287.11 |
| 2013/0032830 A1* | 2/2013 | Lee ...................... | G02B 5/3041 257/88 |
| 2013/0044286 A1 | 2/2013 | Yoon et al. | |
| 2013/0201435 A1* | 8/2013 | Oh ........................ | C09K 19/52 349/186 |
| 2013/0329288 A1* | 12/2013 | Yim .................... | H01L 51/5281 359/483.01 |
| 2015/0179976 A1 | 6/2015 | Galand et al. | |
| 2016/0271894 A1 | 9/2016 | Tang et al. | |

FOREIGN PATENT DOCUMENTS

| | | |
|---|---|---|
| EP | 2 672 541 A2 | 12/2013 |
| JP | 2000-10085 A | 1/2000 |
| JP | 2011170031 A | 9/2011 |
| JP | 2014041776 A | 3/2014 |
| JP | 2014063143 A | 4/2014 |
| JP | 2014122984 A | 7/2014 |
| KR | 20100063292 A | 6/2010 |
| WO | 2014/012931 A1 | 1/2014 |
| WO | 2015/024810 A1 | 2/2015 |

OTHER PUBLICATIONS

International Search Report of PCT/EP2015/067097, dated Oct. 9, 2015. [PCT/ISA/210].
Written Opinion of PCT/EP2015/067097, dated Oct. 9, 2015. [PCT/ISA/237].

* cited by examiner

ENCAPSULATION STRUCTURE FOR AN OLED DISPLAY INCORPORATING ANTIREFLECTION PROPERTIES

CROSS REFERENCE TO RELATED APPLICATIONS

This application is a National Stage of International Application No. PCT/EP2015/067097 filed Jul. 29, 2015, claiming priority based on European Patent Application No. 14179250.7, filed Jul. 31, 2014, the contents of all of which are incorporated herein by reference in their entirety.

TECHNICAL FIELD

The invention relates to encapsulation structures for OLED displays, wherein the structure provides sufficient barrier properties against oxygen and moisture as well as anti-reflection properties. The structure includes a layer comprising a photo-aligned substance which in a synergistic manner controls both barrier and anti-reflection properties.

BACKGROUND OF THE INVENTION

Organic light emitting diode (OLED) displays are already established in the market as an alternative to the yet dominating liquid crystal displays (LCDs), in particular for mobile applications, such as smartphones. A drawback of LCDs is that about two third of the light emitted from the backlight unit is absorbed by the red, green and blue areas of the color filter array. Because in OLED displays the desired red, green and blue light may be directly generated in corresponding color subpixels, no light has to be filtered out for tailoring the spectral emission curve. Together with the continuously improving luminous efficiency of active OLED materials, OLED displays may eventually be brighter than LCDs, which could be a decisive advantage, in particular for outdoor applications, where the light emitted from the display has to compete with the bright sunlight. Unfortunately, reflection of ambient light at the metallic anode layer of an OLED display reduces contrast and hence readability. To reduce the light reflection, OLED displays are equipped with a circular polarizer, which converts incident ambient light into circularly polarized light, which upon reflection at the metallic anode layer is then absorbed by the circular polarizer. Typically, the circular polarizer comprises a linear polarizer and a quarter wave plate, wherein the slow axis of the quarter wave plate is at 45° with respect to the absorption axis of the linear polarizer. Circular polarizers, in which a quarter wave retarder foil is laminated on a polarizer foil are commercially available since many years. Such circular polarizers may be applied on top of OLED devices.

Because of the high sensitivity of active OLED materials to moisture and oxygen, OLED devices have to be properly encapsulated. Glass encapsulation is very effective but is fragile, increases weight and thickness and does not provide high mechanical flexibility. Therefore, thin film encapsulation comprising a barrier stack including one or more barrier layers is desired. Typically, a barrier stack comprises at least one organic and one inorganic layer.

US'2013/0032830A1 discloses a polarizing foil comprising a wave plate, a linear polarizer plate and one or two barrier stacks. The foil incorporating circular polarization and barrier function is attached to a substrate comprising an OLED matrix by interposing an adhesive layer between the polarizing foil and the OLED substrate. Because of the desired optical function, the quarter wave plate has to be between the OLED device and the linear polarizing plate. A barrier stack may be either between the OLED substrate and the quarter wave plate or on the opposite side of the linear polarizing plate with respect to the quarter wave plate. The foil may also comprise two barrier stacks, one of them between OLED substrate and quarter wave plate and the other between quarter wave plate and linear polarizing plate. The polarizing plate is a standard PVA polarizer sheet comprising a PVA layer between two TAC (triacetyl cellulose) films. The quarter wave plate is a flexible foil compatible with roll to roll manufacturing.

In standard roll to roll manufacturing processes of polarizer and quarter wave retarder films both the absorption axis of the polarizer and the slow axis of the retarder film are either longitudinal or transversal to the web moving direction. Therefore, manufacturing of a circular polarizer, which requires an angle of 45° between the directions of the slow axis and of the polarization axis, does not allow to laminate both films in a simple roll to roll process, but requires additional cutting and aligning steps.

Optical retarder films can also be realized by coating a layer of liquid crystalline monomers on a substrate with a surface, which is able to orient liquid crystals. After the liquid crystal monomers are oriented, they may be polymerized or cross-linked in order to solidify the material. Such layers are also known as liquid crystal polymer (LCP) layers. U.S. Pat. No. 6,717,644 discloses cross-linkable liquid crystals, oriented by a thin layer of a photo-alignment material on a substrate.

Because of the demand for thin and lightweight mobile devices as well as for high throughput in production, there is a need for encapsulation structures for OLED displays, which have antireflection properties but are thinner and less complex in production, than what is available from the state of the art.

SUMMARY OF THE INVENTION

Accordingly, the present invention is directed to encapsulation structures for OLED displays, which satisfy the above mentioned needs as well as to the methods of manufacturing such encapsulation structures. The methods involve the use of especially designed materials.

An encapsulation structure according to the invention comprises a linearly polarizing layer, an inorganic layer, a layer comprising a photo-aligned substance and an LCP layer, wherein the liquid crystal orientation in the LCP layer has been created due to contact with the photo-aligned substance. The layer comprising a photo-aligned substance and the inorganic layer are part of a barrier stack in the meaning of the term barrier stack as used in prior art.

The layer comprising the photo-aligned substance may comprise one or more additional substances, which may be photo-alignable.

Preferably, the layer comprising the photo-aligned substance comprises one or more substances, which are not photo-alignable. These substances shall not be a solvent in the usual meaning. Preferably, the ratio of the weight of not photo-alignable substances to the sum of the weight of not photo-alignable substances plus photo-alignable substances is higher than 10%, more preferred higher than 30% and most preferred higher than 70%. The one or more substances are preferably organic materials, which support the barrier properties of the encapsulation structure. In order to improve the barrier properties, the layer comprising the photo-aligned substance may be several micrometers thick. This has the advantage that defects of the underlying layer can be fully covered, and so the defects are not transferred to the upper side of the layer which comprises the photo-aligned substance. Accordingly, thicker layers comprising a photo-aligned substance can be used as planarization layers on top of substrates or additional layers, such as inorganic layers. Of course the barrier properties of the stack according to the invention could also be improved by increasing the thickness of the LCP layer. However, the thickness of the LCP layer changes the optical properties, in particular the retardation properties, which typically have to be set to a certain value. Therefore, the LCP thickness can hardly be used to optimize the barrier properties.

Because the main purpose of the photo-aligned substance is to transfer the alignment information to the LCP layer, it is not required that the photo-aligned substance is equally distributed along the thickness direction of the layer. Therefore, the ratio of the amounts of photo-aligned substance to that of the other compound(s) preferably varies along the thickness direction of the layer, which means that there is a concentration gradient of the photo-aligned substance along the thickness direction. Preferably, the concentration of photo-aligned substance is higher at the side, which is in contact with the LCP layer, than in the middle of the layer.

If the materials are properly selected, a barrier stack consisting of the layer comprising the photo-aligned substance, the LCP layer and the inorganic layer may have sufficient barrier properties against moisture and oxygen. In this case no further layer for improving the barrier properties may be required. Depending on the specification for an OLED display to be encapsulated, it may, however, be necessary to add additional inorganic and/or organic layers to achieve the required barrier performance.

The linearly polarizing layer may be a polarizing foil, which may be used as a substrate for the encapsulation structure or may be laminated together with the stack comprising the layer with the photo-aligned substance and the LCP layer. The polarizing layer may also be generated in additional method steps, for example by coating and aligning a material with polarizing properties, for example comprising anisotropically absorbing molecules. Preferably, the anisotropically absorbing molecules are dichroic dyes embedded in a liquid crystal matrix.

The invention also relates to a method for manufacturing an encapsulated OLED display incorporating anti-reflection properties, wherein a structure according to the invention is applied to an OLED display device.

BRIEF DESCRIPTION OF THE DRAWINGS

The invention is further illustrated by the accompanying drawing figures. It is emphasized that the various features are not necessarily drawn to scale.

FIGS. 1E and 1F are preferred embodiments of the configuration of FIG. 1A, which have an additional adhesive layer below the polarizing layer in FIG. 1E and an alignment layer below the polarizing layer in FIG. 1F.

FIG. 3D is a preferred embodiment of the configuration of FIG. 3A, which has an additional alignment layer beneath the polarizing layer.

DETAILED DESCRIPTION OF THE INVENTION

Figure 1A:
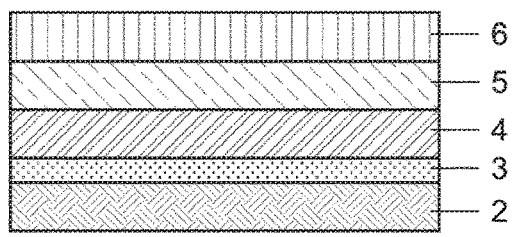
FIGS. 1A, 1B, 1C, 1D, 1E and 1F depicts an encapsulation structure on a substrate, wherein the inorganic layer 3 is arranged at different positions in FIGS. 1A, 1B, 1C and 1D.

According to a first aspect of the invention there is provided an encapsulation structure for an OLED display, which provides sufficient barrier properties against oxygen and moisture as well as anti-reflection properties.

An encapsulation structure according to the invention comprises a linearly polarizing layer, an inorganic layer, a layer comprising a photo-aligned substance and an LCP layer, wherein the liquid crystal orientation in the LCP layer has been created due to contact with the layer comprising a photo-aligned substance.

The layer comprising a photo-aligned substance has the function of an organic layer in a barrier stack. For example, it may be useful as planarization layer, which reduces the occurrence of pinholes.

Preferably, the thickness of the layer comprising a photo-aligned substance is larger than 100 nm, more preferable larger than 500 nm and most preferable larger than 5 μm.

The total thickness of the encapsulation structure incorporating antireflective properties is preferably less than 50 μm, more preferred less than 20 μm and most preferred less than 10 μm.

Preferably in an encapsulation structure according to the invention the total thickness of the inorganic layer, the layer comprising a photo-aligned substance and the LCP layer and any layer in between those layers is less than 60 μm, more preferred less than 40 μm and most preferred less than 30 μm. Additional inorganic and/or organic layers, which may be required to achieve sufficient barrier properties and which are not between the above mentioned layers, are not considered in the calculation of the total thickness of the inorganic layer, the layer comprising a photo-aligned substance and the LCP layer.

For the avoidance of doubt, the encapsulation structure with antireflection properties is for an OLED display and therefore the layers mentioned above as being part of the encapsulation structure for an OLED display are not part of the active OLED structure. In particular, the inorganic layers of the encapsulation structure are not the electrodes of the OLED display and no other layer between the OLED electrodes shall be considered as a layer of the encapsulation structure according to the invention. Likewise, a glass substrate shall not be considered as an inorganic layer of the encapsulation structure according to the invention.

In the context of the present application, a "photo-alignable substance" is a material in which anisotropic properties can be induced upon exposure to aligning light. Analogously, a "photo-alignable layer" is a layer in which anisotropic properties can be induced upon exposure to aligning light. In addition, the terms "photo-aligned substance" and "photo-aligned layer" are used to refer to photo-alignable substances and photo-aligned layers, respectively, which have been aligned by exposure to aligning light. For the present invention the induced anisotropy must be such, that it provides alignment capability for a liquid crystal material. The term "alignment direction" shall refer to the direction in which a liquid crystal in contact with a photo-aligned layer would be aligned.

In the context of the present application, the term "aligning light" shall mean light, which can induce anisotropy in a photo-alignable substance and which is at least partially linearly or elliptically polarized and/or is incident to the surface of a photo-alignable substance from an oblique direction. Preferably, the aligning light is linearly polarized with a degree of polarization of more than 5:1. Wavelengths, intensity and energy of the aligning light are chosen depending on the photosensitivity of the photo-alignable substance. Typically, the wavelengths are in the UV-A, UV-B and/or UV-C range or in the visible range. Preferably, the aligning light comprises light of wavelengths less than 450 nm. More preferred is that the aligning light comprises light of wavelengths less than 420 nm.

If the aligning light is linearly polarized, the polarization plane of the aligning light shall mean the plane defined by the propagation direction and the polarization direction of the aligning light. In case the aligning light is elliptically polarized, the polarization plane shall mean the plane defined by the propagation direction of the light and by the major axis of the polarization ellipse.

The layer comprising a photo-alignable substance may be applied by any suitable method. Suitable coating methods are, for example: spin-coating, blade coating, knife coating, kiss roll coating, cast coating, slot-orifice coating, calendar coating, die coating, dipping, brushing, casting with a bar, roller-coating, flow-coating, wire-coating, spray-coating, dip-coating, whirler-coating, cascade-coating, curtain-coating, air knife coating, gap coating, rotary screen, reverse roll coating, gravure coating, metering rod (Meyer bar) coating, slot die (Extrusion) coating, hot melt coating, roller coating, flexo coating. Suitable printing methods include: silk screen printing, relief printing such as flexographic printing, ink jet printing, intaglio printing such as direct gravure printing or offset gravure printing, lithographic printing such as offset printing, or stencil printing such as screen printing.

Preferably, the layer comprising a photo-alignable substance comprises a getter material. Preferably the getter material is hydrophilic and comprises any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. Preferably the getter material comprises oxide particles, preferably alkaline earth metal oxide particles, preferably calcium oxide(CaO) or barium oxide(BaO) or magnesium oxide(MgO). Preferably, the getter material is in the form of nanoparticles. The size of the getter particles may be between 1 and 1000 nm. It is, however, preferred that the average particle diameter is less than 300 nm and more preferred less than 200 nm. Further it is preferred that the average particle diameter is between 100 nm and 250 nm and most preferred between 150 and 200 nm.

A liquid crystal polymer (LCP) material as used within the context of this application shall mean a liquid crystal material, which comprises liquid crystal monomers and/or liquid crystal oligomers and/or liquid crystal polymers and/or cross-linked liquid crystals. In case the liquid crystal material comprises liquid crystal monomers, such monomers may be polymerized, typically after anisotropy has been created in the LCP material due to contact with a photo-aligned substance. Polymerization may be initiated by thermal treatment or by exposure to actinic light, which preferably comprises uv-light. A LCP-material may consist of a single type of a liquid crystal compound, but may also comprise additional polymerizable and/or non-polymerizable compounds, wherein not all of the compounds have to have liquid crystalline properties. Further, an LCP material may contain additives, for example, a photo-initiator or isotropic or anisotropic fluorescent and/or non-fluorescent dyes. Preferably, the LCP material comprises a getter material. Preferably the getter material is hydrophilic and comprises any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. Preferably the getter material comprises oxide particles, preferably alkaline earth metal oxide particles, preferably calcium oxide(CaO) or barium oxide(BaO) or magnesium oxide(MgO). Preferably, the getter material is in the form of nanoparticles. The size of the getter particles may be between 1 and 1000 nm. It is, however, preferred that the average particle diameter is less than 300 nm and more preferred less than 200 nm. Further it is preferred that the average particle diameter is between 100 nm and 250 nm and most preferred between 150 and 200 nm.

The layer comprising a photo-aligned substance may also comprise aligned LCP molecules, which are polymerized. Due to the birefringence of the aligned LCP-molecules the layer comprising a photo-aligned substance also acts as an optical retarder. Preferably the layer comprising a photo-aligned substance acts as a quarter wave retarder for at least one wavelength of the visible spectrum of light. In the latter case the layer comprising a photo-aligned substance also has the function of the LCP layer, which means that a separate LCP layer is not required.

Within the context of the present application the terms "polymerizable" and "polymerized" shall include the meaning of "cross-linkable" and "cross-linked", respectively. Likewise, "polymerization" shall include the meaning of "cross-linking".

FIGS. 1A, 1B, 1C, 1D, 1E and 1F shows different embodiments of encapsulation structures according to the invention, which includes a substrate 2. The substrate may for example be a flexible foil, preferably a polymer foil or a thin film glass. The substrate is preferably optically isotropic. In FIG. 1A an inorganic layer 3 is above the substrate followed by a layer 4 comprising a photo-alignable substance, which is photo-aligned and has been used to align the liquid crystals of the polymerized liquid crystal layer 5. Further, a polarizing layer 6 is arranged above the liquid crystal layer.

Figure 1B:
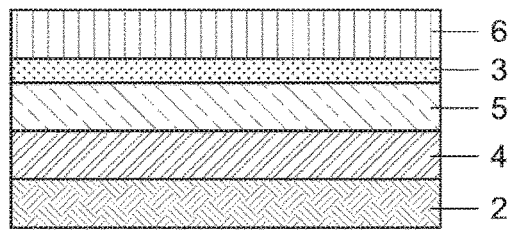
Figure 1C:
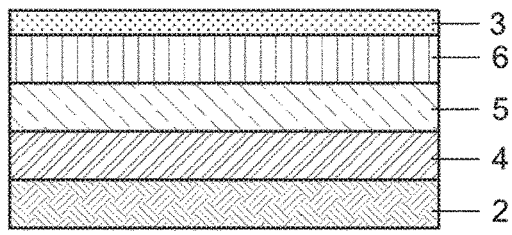
Figure 1D:
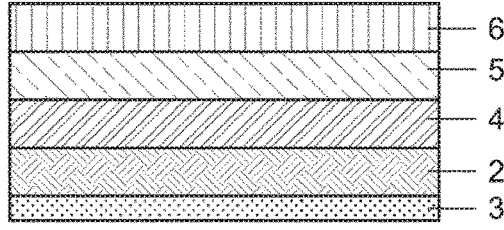

FIGS. 1B, 1C and 1D are alternative embodiments to that of FIG. 1A, wherein the only difference to the embodiment of FIG. 1A is the position of the inorganic layer 3. In the embodiment of FIG. 1B the inorganic layer is between the liquid crystal layer and the polarizing layer. In FIG. 1C the inorganic layer is on top of the polarizing layer, which means on the opposite side of the liquid crystal layer. In FIG. 1D the inorganic layer is arranged on the opposite side of the substrate with respect to the layers 4, 5 and 6. Of course, any combination of FIGS. 1A, 1B, 1C and 1D is possible, which means that the encapsulation structure may comprise more than one inorganic layer, which may be arranged at the positions indicated in FIGS. 1A, 1B, 1C and 1D. For example, an encapsulation structure may comprise four inorganic layers, wherein one inorganic layer is between substrate 2 and the layer comprising a photo-alignable substance 4, as in FIG. 1A; a second inorganic layer may be arranged between the liquid crystal layer 5 and the polarizing layer 6, as in FIG. 1B; a third inorganic layer may be arranged above the polarizing layer 6, as in FIG. 1C and a fourth inorganic layer may be located beneath the substrate 2, as in FIG. 1D. Preferably, there is an adhesive layer between the liquid crystal layer 5 and the polarizing layer of the embodiments of FIG. 1A, 1C or 1D or between the inorganic layer 3 and the polarizing layer of the embodiment of FIG. 1B.

Figure 1E:
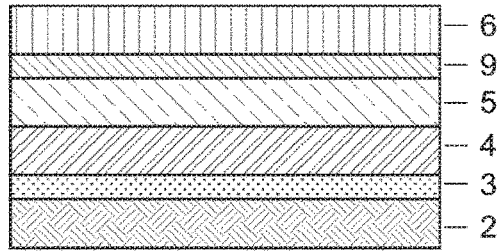

The polarizing layer may be a polarizing foil, preferably comprising a layer of polyvinyl alcohol, which may be sandwiched between two polymer films, for example TAC (triacetate) films. Such polarizers are produced roll to roll and may be laminated on top of the LCP layer in the embodiments of FIGS. 1A, 1C and 1D or on the inorganic layer of FIG. 1B. However, there may be additional layers, for example a hard coating, between LCP layer and polarizer or inorganic layer and polarizer, respectively, such that the polarizer is not necessarily laminated on the LCP or inorganic layer, respectively. For lamination an adhesive layer may be in contact with the polarizer sheet. FIG. 1E depicts an example, which corresponds to the embodiment of FIG. 1A, wherein an adhesive layer 9 is between the LCP layer 5 and the polarizer sheet 6.

Figure 1F:
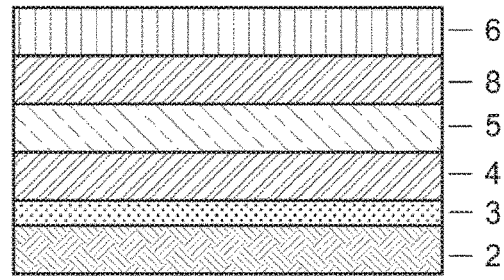

Preferably, coatable polarizers are used as a polarizing layer 6. Coatable polarizers typically comprise anisotropically absorbing molecules, such as carbon nanotubes or dichroic dyes, which are dissolved in a host material. Alignment of coatable polarizers can be done by different methods such as shearing the material during or after application to a substrate or by applying the coatable polarizer material to a substrate having a surface with alignment capability, such as surfaces which were brushed, photo-aligned or have an anisotropic surface structure. Preferably, the coatable polarizer material comprises polymerizable liquid crystals and dichroic dyes. For generation of a polarizing layer it is preferred to employ an additional layer comprising a photo-alignable substance, which after having been photo-aligned provides a surface with alignment capability and to coat a composition comprising polymerizable liquid crystals and dichroic dyes on top of it. FIG. 1F shows an example corresponding to the embodiment of FIG. 1A, wherein and additional layer 8 comprising a photo-alignable substance is in contact with the polarizing layer made from a coatable polarizing material. Preferably, the coatable polarizing material comprises a getter material. Preferably the getter material is hydrophilic and comprises any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. Preferably the getter material comprises oxide particles, preferably alkaline earth metal oxide particles, preferably calcium oxide(CaO) or barium oxide(BaO) or magnesium oxide(MgO). Preferably, the getter material is in the form of nanoparticles. The size of the getter particles may be between 1 and 1000 nm. It is, however, preferred that the average particle diameter is less than 300 nm and more preferred less than 200 nm. Further it is preferred that the average particle diameter is between 100 nm and 250 nm and most preferred between 150 and 200 nm.

Depending on the absorption properties of coatable polarizer material, coated polarizers may be created which are substantially thinner than standard sheet polarizers. Preferably, the thickness of a coated polarizer is less than 10 μm, more preferred less than 5 μm and most preferred less than 2 μm.

Figure 2A:
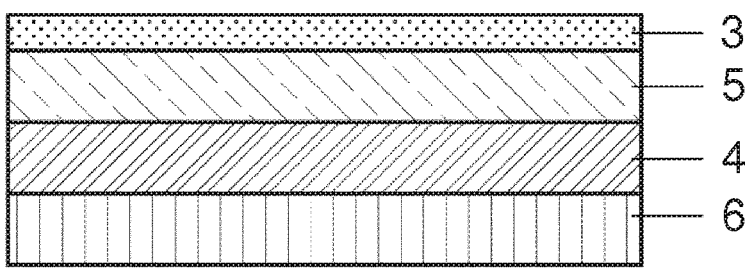
FIGS. 2A, 2B and 2C depicts an encapsulation structure, wherein a polarizing film 6 is used as a substrate. The inorganic layer 3 is arranged at different positions in FIGS. 2A, 2B and 2C.
Figure 2B:
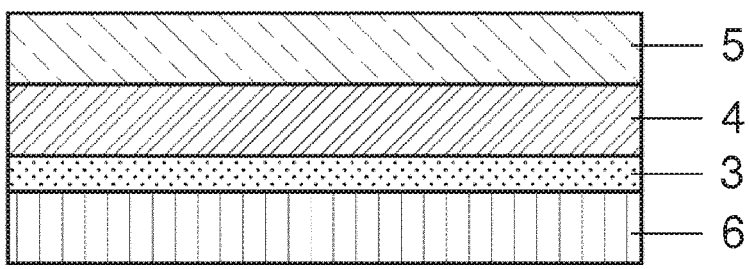
Figure 2C:
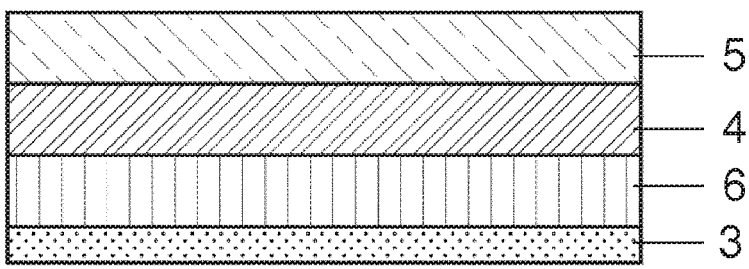

FIGS. 2A, 2B and 2C shows embodiments, in which the polarizing layer 6 is used as a substrate. Preferably, the polarizing layer is a flexible sheet polarizer, comprising one or more polymer films like described above. In FIG. 2A a layer 4 comprising a photo-alignable substance is arranged on the polarizing layer followed by a polymerized liquid crystal layer 5. The inorganic layer 3 is arranged on the liquid crystal layer opposite to the side of the polarizing layer.

The difference of the embodiments of FIGS. 2B and 2C compared to 2A is again the position of the inorganic layer 3, which may be between polarizing layer 6 and liquid crystal layer 4 (FIG. 2B) or beneath the polarizing layer, which means on the opposite side of the liquid crystal layer (FIG. 2C). As discussed with regard to the embodiments of FIGS. 1A, 1B, 1C, 1D, 1E and 1F, any combination of FIGS. 2A, 2B and 2C is possible, which means that the encapsulation structure may comprise more than one inorganic layer, which may be arranged at the positions indicated in FIGS. 2A, 2B and 2C.

Figure 3A:
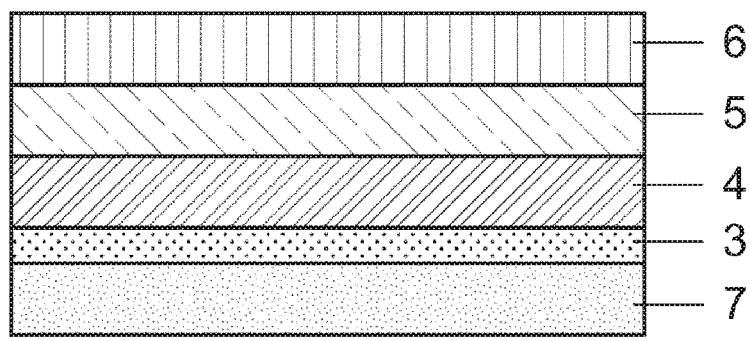
FIGS. 3A, 3B, 3C and 3D shows embodiments of an encapsulation structure on an OLED device. The inorganic layer 3 is arranged at different positions in FIGS. 3A, 3B and 3C.
Figure 3B:
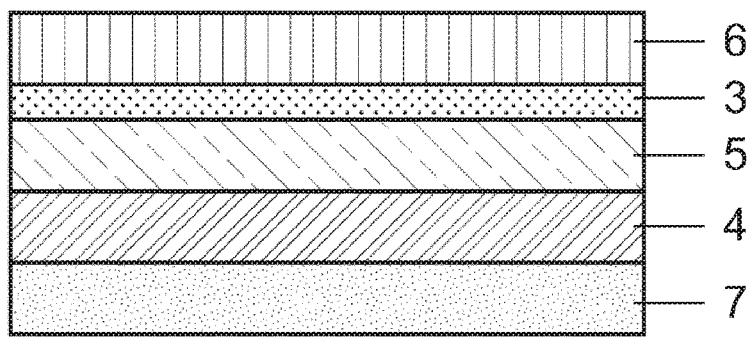
Figure 3C:
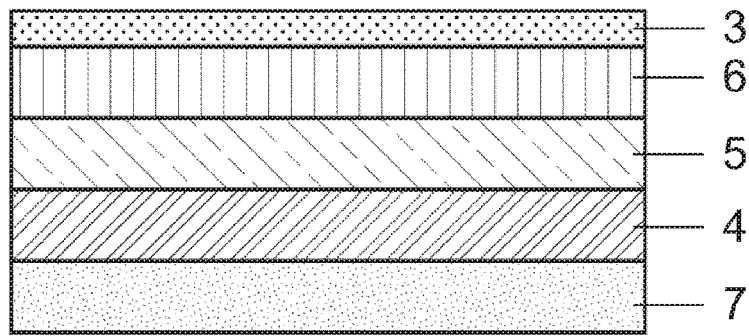
Figure 3D:
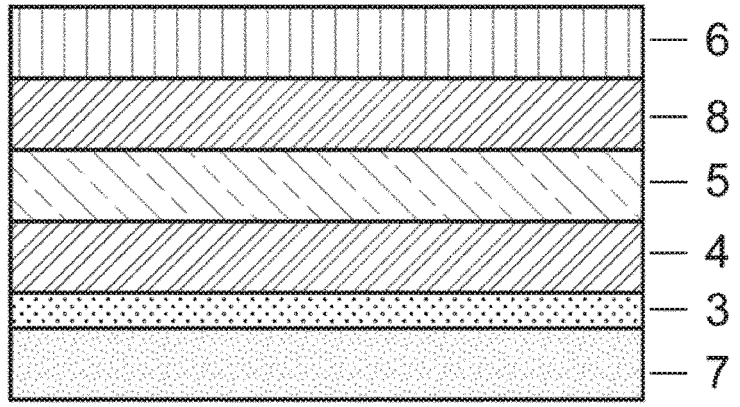
Figure 4A:
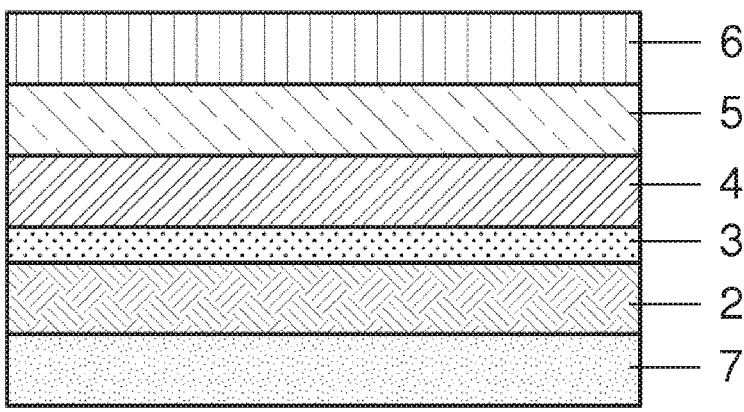
FIGS. 4A, 4B, 4C and 4D shows embodiments of an encapsulation structure including an additional substrate applied on an OLED device. The inorganic layer 3 is arranged at different positions in FIGS. 4A, 4B, 4C and 4D.
Figure 4B:
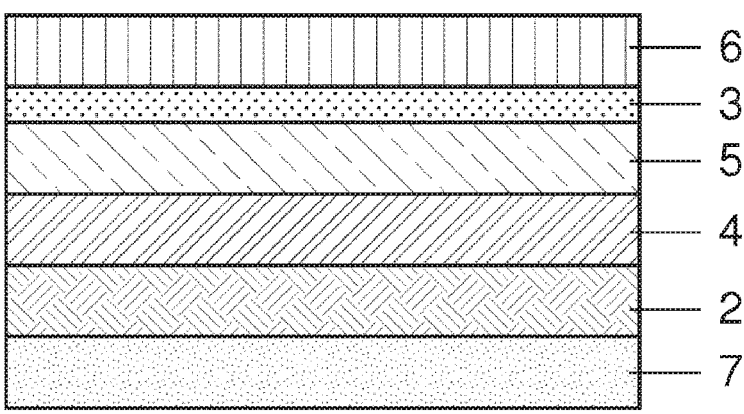
Figure 4C:
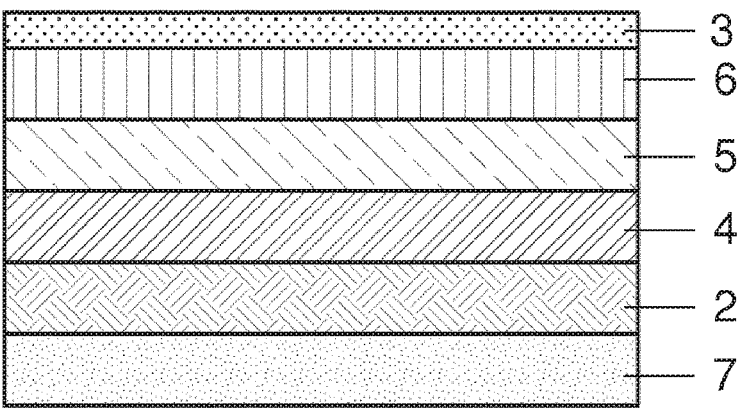
Figure 4D:
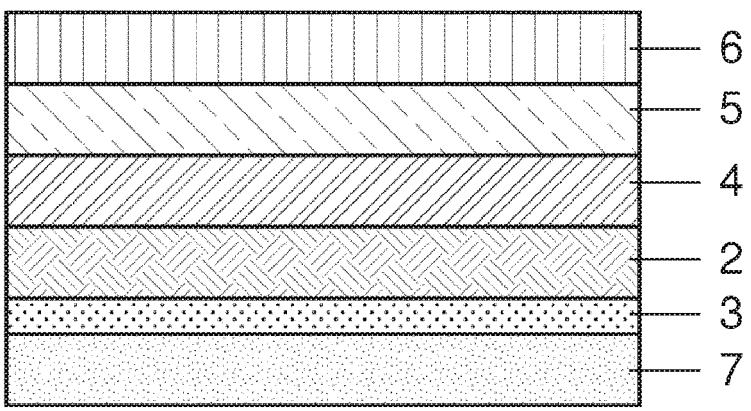

FIGS. 3A, 3B, 3C and 3D shows different embodiments of an encapsulation structure applied to device 7 comprising an OLED matrix. For example, the different layers can be applied one after the other on the OLED device. Accordingly, the layer 4 comprising the photo-alignable substance is between the OLED device 7 and the polymerized liquid crystal layer 5. The polarizing layer 6 is on the side of the liquid crystal layer opposite to the OLED device. One or more inorganic layers 3 may be arranged between the OLED matrix 7 and the layer 4 comprising the photo-alignable substance (FIG. 3A) and/or between the liquid crystal layer 5 and the polarizing layer 6 (FIG. 3B) and/or above the polarizing layer (FIG. 3C) on the opposite side of the liquid crystal layer. Preferably, the polarizing layer is a coated polarizer as described above. FIG. 3D depicts an example corresponding to FIG. 3A, wherein and additional layer 8 comprising a photo-alignable substance is in contact with the polarizing layer made from a coatable polarizing material. The encapsulation structure of FIG. 3D may be very thin as all of the layers may be applied one after the other on the OLED device without an additional substrate. Because each of the layer is in the range of a few microns, the total thickness of the encapsulation structure incorporating anti-reflective properties may be less than 20 μm or even less than 10 μm.

FIGS. 4A, 4B, 4C and 4D shows embodiments of encapsulated OLED displays, wherein the encapsulation structures of FIGS. 1A, 1B, 1C and 1D are applied to an OLED device 7 (FIGS. 4A, 4B, 4C and 4D). An adhesive layer may be between the OLED device and the encapsulation structure.

In a preferred embodiment, the polarizing layer is a foil that is laminated on top of the structure. An adhesive layer may be below the polarizing foil, as described above with regard to the embodiment of FIG. 1E. In another preferred embodiment, the polarizing layer is made from a coatable polarizer material, preferably comprising polymerizable liquid crystals and dichroic dyes. Preferably, such coatable polarizer is aligned by an additional layer beneath the polarizer layer, which preferably comprises a photo-alignable substance, as discussed above with regard to FIG. 1F.

Figure 5A:
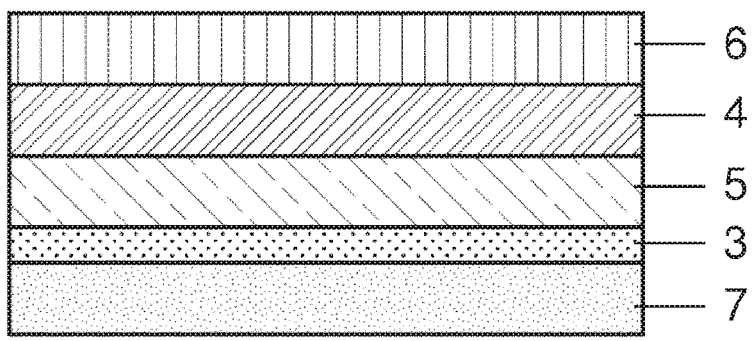
FIGS. 5A, 5B and 5C depicts embodiments of an encapsulation structure on an OLED matrix, which may result from applying the encapsulation structures of FIG. 2 to the OLED matrix.
Figure 5B:
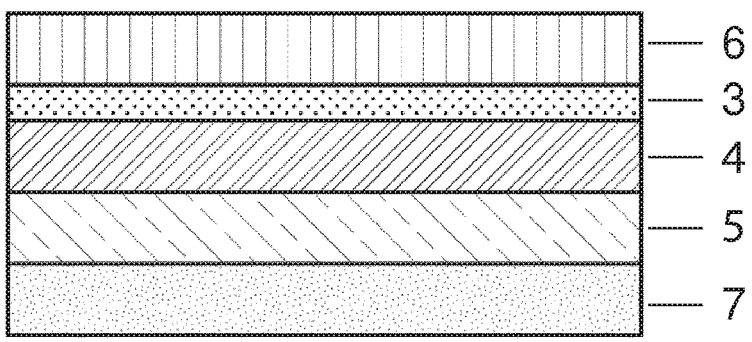
Figure 5C:
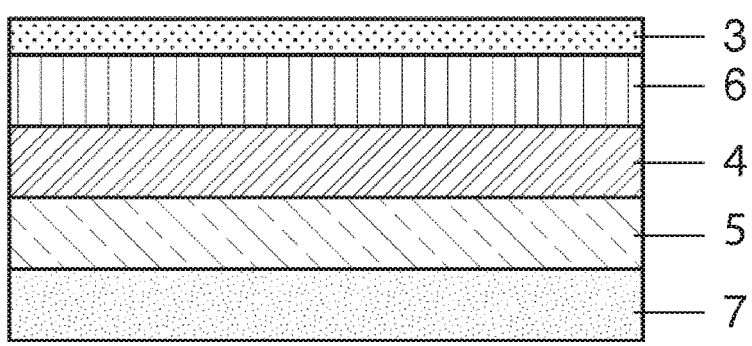

FIGS. 5A, 5B and 5C shows embodiments of encapsulated OLED displays, wherein the encapsulation structures of FIGS. 2A, 2B and 2C are applied to an OLED device 7 (FIGS. 5A, 5B and 5C), such that the liquid crystal layer 5 is between the OLED device and the polarizing layer. An adhesive layer may be between the OLED device and the encapsulation structure.

A further advantage of the encapsulation structure incorporating antireflection properties of the present invention, is that one or more of the layers may easily be laterally structured. This can, for example, be done by local deposition of the individual layers in the desired shape and position, for example by printing methods such as offset or ink-jet, or by physical or chemical vapor deposition. Alternatively, the layers may be applied in a larger area as desired for the application and subsequently removing the material in the layers in non-desired areas. This could be done by different well known methods in the art, including photolithographic methods. Since most of the layers according to the present invention comprise compounds, which are polymerizable, the preferred method of removing the non-desired material is by only locally polymerizing the materials within the layers in the desired areas, in particular by local uv-irradiation, and subsequently removing the non-polymerized material outside the desired area, for example using a suitable solvent.

Figure 6:
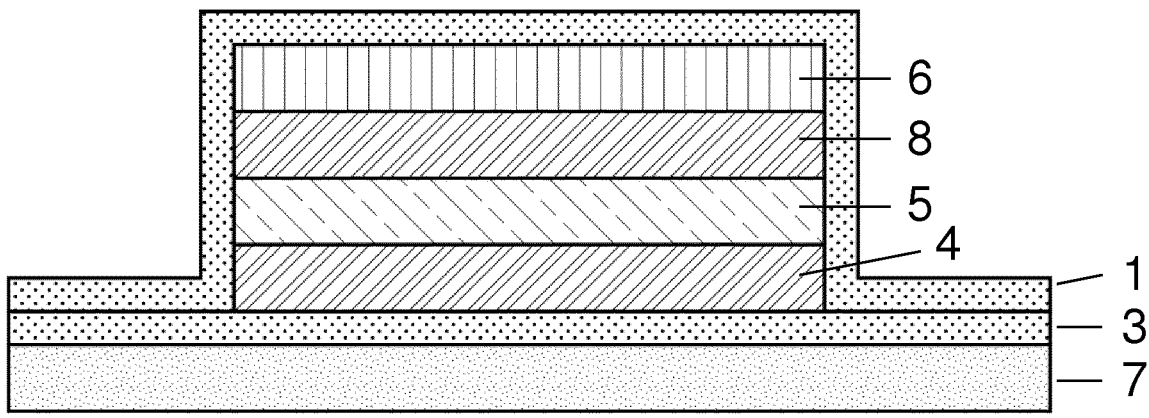
FIG. 6 shows an example of embodiments, wherein one or more layers are laterally structured and the whole structure is covered with an inorganic layer to prevent side leakage.

By laterally structuring the thin layers of the present invention, it is possible to increase the resistance against oxygen and moisture by preventing the side leakage through the edges of the layers. FIG. 6 shows an example of an encapsulated OLED display, wherein the OLED device 7 comprising the OLED matrix is fully covered with an inorganic layer 3. However, first and second layers 4 and 8 comprising a photo-alignable substance, the liquid crystal layer 5 and the polarizing layer 6 are laterally structured and cover a smaller area of the OLED device, in particular the area of the OLED matrix. An inorganic layer 1, which is deposited over the whole structure acts as a barrier layer not only on the large surface area parallel to the OLED matrix, but also at the edges of each of the layers. Accordingly, all of the layers of FIG. 7 may synergistically contribute to the barrier properties. It is obvious that the production of similar layer structures with state of the art sheet retarders and polarizers is more complex and it can be expected that the barrier properties of encapsulation structures according to the present invention can only be achieved with state of the art retarders and polarizers by adding additional layers, for example for smoothing the surface of the sheet retarder and polarizer, which also adds additional process steps.

The layers drawn adjacent to each other in FIGS. 1A through 6 may be in direct contact. However, it is also possible that additional layers may be arranged between any pair of layers of the encapsulation structures, except between the layer comprising a photo-alignable substance 4 and the liquid crystal layer 5 and except between the additional layer 8 comprising a photo-alignable substance and the polarizing layer 6.

The inorganic layer may be applied by a vacuum deposition technology such as physical or chemical vapor deposition, including plasma-enhanced and plasma-assisted chemical vapor deposition, sputtering and electron beam physical vapour deposition.

The inorganic layer may comprise a single inorganic material or a composition of two or more inorganic materials. Examples of inorganic materials that may be applied are metal or semiconductor oxides such as aluminum oxide, silicon oxide and indium tin oxide, metal or semiconductor nitrides such as boron nitride and silicon nitride, or metal or semiconductor oxynitrides such as aluminium oxynitride or silicon oxynitride. Preferred are inorganic layers comprising $SiO_y$, $Si_xN_y$ or $Al_xO_y$. In particular silicon nitrides ($Si_xN_y$) are preferred. The compositions may be stoichiometric or not.

The thickness of the inorganic layer lies typically between 1 nm and 1000 nm. Preferably, the thickness is between 10 nm and 500 nm, more preferred in the range of 50 nm to 300 nm and most preferred between 100 nm and 250 nm. The liquid crystal layer 5 preferably acts as a quarter wave retarder for at least one wavelength of the visible spectrum of light. Because of the strong birefringence of liquid crystal materials, a liquid crystal quarter wave retarder layer typically has a thickness in the range of 0.4 μm to 3 μm, depending on the optical anisotropy of the liquid crystal material. Preferably, the liquid crystal layer acts as an achromatic retarder. When using liquid crystal materials, which do not have achromatic properties, it is possible to achieve achromatic retardance by adding a second liquid crystal layer in the encapsulation structure, which also acts as a retarder. Preferably, the optical axis direction of the second retarder layer is different from the optical axis direction of the first retarder layer. By proper design of thickness and optical axis direction of the two liquid crystal retarder layers it is possible to achieve achromatic retarder performance. Preferably, the second liquid crystal layer is aligned by another layer comprising a photo-alignable substance.

A further advantage of the present invention is that the liquid crystal layer may have an orientation pattern. This can be done by selectively photo-aligning different regions of the layer comprising the photo-alignable substance in different directions. The generated alignment pattern is adapted by the liquid crystal layer, which accordingly forms a patterned retarder with regionally different optical axis direction. Because of the high resolution of the photo-alignment process, individual regions may be very small, for example smaller than what can be resolved by a human eye. The pattern may therefore be useful for encoding any kind of information that may or may not be seen by a human eye, in particular for recognition by opto-electronic systems.

According to a second aspect of the invention there is provided a method for manufacturing an encapsulated OLED display incorporating anti-reflection properties, comprising the steps of generating an OLED display device on a substrate encapsulating the OLED device with an encapsulation structure, which provides antireflective properties, the structure including an inorganic layer, a layer comprising a photo-aligned substance, a liquid crystal polymer layer in contact with the layer comprising a photo-aligned substance and a linear polarizing layer, such that the liquid crystal polymer layer is between the OLED device and the polarizing layer.

In a preferred embodiment of the invention, the encapsulation structure is manufactured on a separate substrate, such as the structure depicted in FIGS. 1A, 1B, 1C, 1D, 1E, 1F, 2A, 2B and 2C and subsequently applied to the OLED device, which results in encapsulated OLED devices, for example like the embodiments depicted in FIGS. 4 and 5. Preferably, the structure is applied to the OLED device by lamination. An adhesive layer may be between the OLED device and the encapsulation stack. Preferably, the separate substrate is flexible, such as a flexible foil, preferably a polymer foil or a thin film glass. Preferably, the separate substrate is a polarizing foil.

In another preferred embodiment of the invention, the individual layers required for the encapsulation structure are deposited one after the other on the OLED device, such that the encapsulation structure is directly formed on the OLED device. Alternatively, it is possible to deposit one or more layers directly on the OLED device and add other layers by lamination. For example, an inorganic layer, a layer comprising a photo-aligned substance and a liquid crystal polymer layer may be formed on the OLED device, whereas the polarizing layer is applied by lamination of a polarizing foil.

The layer comprising a photo-alignable substance is exposed to aligning light of a desired polarization direction in order to align the molecules of the photo-alignable substance.

A layer comprising a photo-alignable substance may be generated by coating, printing or casting of a suitable material. The material may be applied over the full area of a support or only on parts of it. Suitable methods include spin-coating, blade coating, knife coating, kiss roll coating, cast coating, slot-orifice coating, calendar coating, die coating, dipping, brushing, casting with a bar, roller-coating, flow-coating, injection-molding, wire-coating, spray-coating, dip-coating, whirler-coating, cascade-coating, curtain-coating, air knife coating, gap coating, rotary screen, reverse roll coating, gravure coating, metering rod (Meyer bar) coating, slot die (Extrusion) coating, hot melt coating, roller coating, flexo coating, silk screen printer, relief printing such as flexographic printing, ink jet printing, 3D-printing, intaglio printing such as direct gravure printing or offset gravure printing, lithographic printing such as offset printing, or stencil printing such as screen printing. The material may be diluted in a solvent for easier deposition. Deposition of the material may be done under normal atmospheric pressure or under vacuum conditions. In the latter case, it is preferred that the material does not comprise a solvent.

Solvent free compositions are also preferred because a heating step for evaporating the solvents or for curing might not be compatible with the layer structure onto which the above composition is coated, in particular if the composition is coated onto an assembly comprising an OLED structure. In addition, the solvent itself might damage materials of the layer structure underneath the layer made from the composition.

Preferably, the material composition comprises at least one photo-alignable substance and at least one additional substance, wherein the substances are so selected that in a layer formed with the material on a support, phase separation can occur, such that the concentration of at least one sort of photo-alignable substance is higher close to the surface opposite to the support than in the bulk of the layer.

Preferably, the material comprising the photo-alignable substance comprises one or more substances, which are polymerizable but not photo-alignable. Preferably, the ratio of the weight of polymerizable but not photo-alignable substances to the sum of the weight of polymerizable but not photo-alignable substances and the photo-alignable substances is higher than 10%, more preferred higher than 30% and most preferred higher than 70%. Due to the additional polymerizable substance, the above method may comprise an additional step, in which the polymerization of such substances within the layer generated from the material comprising the photo-alignable substance is initiated. Preferably, polymerization is initiated by exposure to actinic light. The step of polymerization can be before, after or simultaneously to the step of exposing the layer to aligning light. In a preferred embodiment of the method, aligning light is used to align the photo-alignable substance and to initiate polymerization of the additional polymerizable substances. In another preferred embodiment, the step in which the additional substances are polymerized is after the step of exposing the layer comprising photo-alignable substance to aligning light. Preferably, the environmental atmosphere comprises oxygen during exposure of the layer to aligning light. Preferably, the amount of oxygen is reduced in the environmental atmosphere, compared to the natural oxygen content during polymerization of the additional substances. More preferably, polymerization of the additional substances is done in inert atmosphere or vacuum. Preferably, the wavelength range of the light, which is used to initiate polymerisation of the additional, not photo-alignable substances, is different from the wavelength range of the aligning light used to initiate photo-alignment of the photo-alignable substance. This has the advantage, that initiation of polymerisation of the additional substances and creation of anisotropy due to photo-alignment can be individually addressed by the wavelength of the light.

A layer comprising a liquid crystal polymer material is applied on top of the photo-aligned layer. After the liquid crystal material has properly adapted the alignment direction provided by the photo-aligned layer, polymerization of the polymerizable liquid crystal material is initiated.

Preferably the parameters for the LCP layer are selected such that a quarter wave retarder results, effective for a desired wavelength. More preferred is that the LCP layer is achromatic and provides substantially quarter wave retardance for most of the visible wavelength range.

Preferably, the LCP material comprises a getter material. Preferably the getter material is hydrophilic and comprises any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. Preferably the getter material comprises oxide particles, preferably alkaline earth metal oxide particles, preferably calcium oxide(CaO) or barium oxide(BaO) or magnesium oxide(MgO). Preferably, the getter material is in the form of nanoparticles. The size of the getter particles may be between 1 and 1000 nm. It is, however, preferred that the average particle diameter is less than 300 nm and more preferred less than 200 nm. Further it is preferred that the average particle diameter is between 100 nm and 250 nm and most preferred between 150 and 200 nm.

The LCP material may be applied by coating and/or printing with or without solvent and may be applied over the full area of the layer comprising the photo-aligned substance or only on parts of it. An LCP material may, for example, be applied by a printing, coating or casting method, which include, but is not limited to: spin-coating, blade coating, knife coating, kiss roll coating, cast coating, slot-orifice coating, calendar coating, die coating, dipping, brushing, casting with a bar, roller-coating, flow-coating, injection-molding, wire-coating, spray-coating, dip-coating, whirler-coating, cascade-coating, curtain-coating, air knife coating, gap coating, rotary screen, reverse roll coating, gravure coating, metering rod (Meyer bar) coating, slot die (Extrusion) coating, hot melt coating, roller coating, flexo coating, silk screen printer, relief printing such as flexographic printing, ink jet printing, 3D-printing, intaglio printing such as direct gravure printing or offset gravure printing, lithographic printing such as offset printing, or stencil printing such as screen printing.

Preferably, the method involves heating the LCP material before or after applying it to the layer comprising the photo-aligned substance. Depending on the nature of the LCP material, it may be helpful to perform the polymerization under inert atmosphere, such as nitrogen, or under vacuum.

Preferably, the substrate is a flexible foil and the encapsulation structure providing anti-reflection properties is produced in a roll to roll process. The resulting film may finally be wound on a roll together with the substrate foil or the layers forming the encapsulation structure may be released from the substrate and are then wound as a free standing film without the substrate.

Preferably, the substrate is a flexible polarizing foil, which has the function of a polarizing layer. This has the advantage that no other substrate is required and the layers required for the encapsulation structure can be applied one after the other on the polarizing foil, preferably in a roll to roll process.

According to a third aspect of the invention there is provided a material composition comprising a photo-alignable substance for use in the methods and devices according to the invention.

The material composition comprising a photo-alignable substance may comprise more than one type of photo-alignable substances.

In a preferred embodiment, the material composition comprising a photo-alignable substance further comprises liquid crystal monomers. Preferably, the composition without solvents has a liquid crystal phase above room temperature.

The material composition comprising a photo-alignable substance may comprise additional substances which do not comprise photo-alignable moieties. Such substances include polymers, dendrimers, oligomers, prepolymers and monomers, which may be polymerized during or after the manufacturing of the layer. Examples of classes of suitable polymers are, but not limited to: polyalkylenes, such as polyethylene, polypropylene, polycycloolefine COP/COC, polybutadiene, poly(meth)acrylates, polyester, polystyrene, polyamide, polyether, polyurethane, polyimide, polyamide acid, polycarbonate, poly-vinylalcohol, poly-vinylchloride, cellulose and cellulose derivatives such as cellulose triacetate. Examples of suitable classes of monomers are: mono and multifunctional acrylates and methacrylates, epoxies, isocyanate, allyl derivatives and vinyl ethers. Preferably, the composition comprising a photo-alignable substance comprises a getter material. Preferably the getter material is hydrophilic and comprises any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. Preferably the getter material comprises oxide particles, preferably alkaline earth metal oxide particles, preferably calcium oxide(CaO) or barium oxide(BaO) or magnesium oxide(MgO). Preferably, the getter material is in the form of nanoparticles. The size of the getter particles may be between 1 and 1000 nm. It is, however, preferred that the average particle diameter is less than 300 nm and more preferred less than 200 nm. Further it is preferred that the average particle diameter is between 100 nm and 250 nm and most preferred between 150 and 200 nm. The properties of the composition are preferably optimized for ink-jet printing.

Suitable substances and mixtures of substances which do not comprise photo-alignable moieties and which support the barrier properties are in particular those disclosed in WO2014012931, which is hereby incorporated by reference. In particular, WO2014012931 discloses recipes for making solvent free radiation curable resin compositions for water scavenging layers in multilayer barrier stacks for OLED encapsulation.

The term substances with regard to the material composition comprising a photo-alignable substance shall not include solvents.

In the context of this invention a solvent is a compound, which dilutes a composition and is helpful for the preparation of a formulation comprising the composition and for coating or printing a layer of the composition, but which will later be removed, for example by drying. In other words, the meaning of the term substances includes only those compounds which remain in the final layer.

In particular, the following compounds are considered as solvents: hexane, benzene, toluene, diethyl ether, chloroform, ethyl acetate, dichloromethane, chlorobenzene, 1,4-dioxane, tetrahydrofuran (THF), acetone, acetonitrile (MeCN), dimethyl sulfoxide (DMSO), N-methylpyrrolidone (NMP), ethylpyrrolidone, N-vinylpyrrolidone, 2-butoxyethanol (BC), gamma-butyrolactone (BL), N-methylmorpholine, acetonitrile, ethylcarbitol, butylcarbitol, ethylcarbitol acetate, ethylene glycol, propylene glycol monoacetate, propylene glycol diacetate, dipropylene glycol, and dipropylene glycol monomethyl ether, 1,2-dichlorobenzene, tetrahydrofuran, N,N-dimethylacetamide, ethylcellosolve, butylcellosolve, cyclopentanone (CP), methylethylketone (MEK), ethyl acetate (EA), anisole (AN), cyclohexanone (CHN), methyl isobutyl ketone (MIBK), 1-methoxy-2-propanol acetate (MPA), N,N-dimethyl-formamide (DMF), acetic acid, n-butanol, isopropanol, n-propanol, ethanol, methanol, formic acid, water, cyclopentane, pentane, petroleum ether, heptane, diethyl amine, tert-butyl methyl ether, cyclohexane, tert-butyl alcohol, isobutyl alcohol, isoamyl alcohol, diethyl ketone, 1-octanol, p-xylene, m-xylene, dimethoxyethane, butyl acetate, 1-chlorobutane, o-xylene, 2-ethoxyethyl ether, diethylene glycol dimethyl ether, 2-methoxyethanol, pyridine, propanoic acid, 2-methoxyethyl acetate, benzonitrile, hexamethylphosphoramide, acetic anhydride, diethylene glycol, propylene carbonate, 1,2-dichloroethane, glycerin, carbon disulfide, methylene chloride, nitromethane, nitromethane, chloroform, 1,1, 2-trichlorotrifluoroethane, carbon tetrachloride and tetrachloroethylene.

The material composition comprising a photo-alignable substance may contain additives for improving adhesion and/or a photo-initiator.

Depending on the type of substances in the composition, phase separation between the photo-alignable substance and the other substances may occur. By proper choice of the material composition it is possible to control phase separation such that upon manufacturing a layer, most of the photo-alignable substance separates to the free surface of the layer. This further allows to reduce the amount of photo-alignable substance in the composition. Preferably the weight ratio of the sum of the photo-alignable substances to the sum of the other substances is less than 50%, more preferable less than 20% and most preferably less than 10%. Depending on the thickness of the layer that was made with the material composition, the amount of photo-alignable substances may be less than 1 wt % or even less than 0.1 wt %. In extreme cases 0.01 wt % of photo-alignable substance is enough to still achieve sufficient alignment properties. Preferably, the photo-alignable substance comprises fluorinated and/or siloxane moieties and/or is a polysiloxane, in order to support phase separation.

In a preferred embodiment, a composition according to the invention comprises a photo-alignable substance and another substance, which may be photo-alignable or not. Both, the photo-alignable substance and the other substance may be a polymer, a dendrimer, a oligomer, a prepolymer or a monomer. In order to support phase separation, the photo-alignable substance and the other substance are so selected that the monomer dipole moments of the photo-alignable substance and the other substance are different from each other. The monomer dipole moment shall refer to the dipole moment of a monomer or in case of polymers, oligomers and prepolymers to the dipole moment of monomeric units of such polymers, oligomers and prepolymers, respectively. Preferably, the monomer dipole moments differ by more than 0.5 Debye, more preferably by more than 1 Debye and most preferred by more than 1.5 Debye. The composition may contain additional photo-alignable or non-photo-alignable substances.

A photo-alignable substance for a composition for manufacturing a layer according to the invention may be any kind of photo-sensitive material in which anisotropic properties, which provide alignment properties for LCP materials can be created upon exposure to aligning light, independent from the photo-reaction mechanism. Therefore, suitable photo-alignable substances are, for example, materials in which upon exposure to aligning light the anisotropy is induced by photo-dimerization, photo-decomposition, trans-cis isomerization or photo-fries rearrangement.

Photo-alignable substances, as those described above, incorporate photo-alignable moieties, which are capable of developing a preferred direction upon exposure to aligning light and thus creating anisotropic properties. Such photo-alignable moieties preferably have anisotropic absorption properties. Typically, such moieties exhibit absorption within the wavelength range from 230 to 500 nm. Preferably, the photo-alignable moieties exhibit absorption of light in the wavelength range from 300 to 450 nm, more preferred are moieties, which exhibit absorption in the wavelength range from 350 to 420 nm.

Preferably the photo-alignable moieties have carbon-carbon, carbon-nitrogen, or nitrogen-nitrogen double bonds.

For example, photo-alignable moieties are substituted or un-substituted azo dyes, anthraquinone, coumarin, mericyanine, 2-phenylazothiazole, 2-phenylazobenzthiazole, stilbene, cyanostilbene, fluorostilbene, cinnamonitrile, chalcone, cinnamate, cyanocinnamate, stilbazolium, 1,4-bis(2-phenylethylenyl)benzene, 4,4'-bis(arylazo)stilbenes, perylene, 4,8-diamino-1,5-naphthoquinone dyes, aryloxycarboxylic derivatives, arylester, N-arylamide, polyimide, diaryl ketones, having a ketone moiety or ketone derivative in conjugation with two aromatic rings, such as for example substituted benzophenones, benzophenone imines, phenylhydrazones, and semicarbazones.

Preparation of the anisotropically absorbing materials listed above are well known as shown, e.g. by Hoffman et al., U.S. Pat. No. 4,565,424, Jones et al., in U.S. Pat. No. 4,401,369, Cole, Jr. et al., in U.S. Pat. No. 4,122,027, Etzbach et al., in U.S. Pat. No. 4,667,020, and Shannon et al., in U.S. Pat. No. 5,389,285.

Preferably, the photo-alignable moieties comprise arylazo, poly(arylazo), stilbene, cyanostilbene, cinnamate or chalcone.

A photo-alignable substance may have the form of a monomer, oligomer or polymer. The photo-alignable moieties can be covalently bonded within the main chain or within a side chain of a polymer or oligomer or they may be part of a monomer. A photo-alignable substance may further be a copolymer comprising different types of photo-alignable moieties or it may be a copolymer comprising side chains with and without photo-alignable moieties.

Polymers denotes for example to polyacrylate, polymethacrylate, polyimide, polyurethane, polyamic acids, polymaleinimide, poly-2-chloroacrylate, poly-2-phenylacrylate; unsubstituted or with $C_1$-$C_6$alkyl substituted poylacrylamide, polymethacyrlamide, poly-2-chloroacrylamide, poly-2-phenylacrylamide, polyether, polyvinylether, polyester, polyvinylester, polystyrene-derivatives, polysiloxane, straight-chain or branched alkyl esters of polyacrylic or polymethacrylic acids; polyphenoxyalkylacrylates, polyphenoxyalkylmethacrylates, polyphenylalkylmeth-acrylates with alkyl residues of 1-20 carbon atoms; polyacrylnitril, polymethacrylnitril, cycloolephinic polymers, polystyrene, poly-4-methylstyrene or mixtures thereof.

A photo-alignable substance may also comprise photosensitizers, for example, ketocoumarines and benzophenones.

Further, preferred photo-alignable monomers or oligomers or polymers are described in U.S. Pat. Nos. 5,539,074, 6,201,087, 6,107,427, 6,632,909 and 7,959,990.

EXAMPLES

For the evaluation of the performance of the encapsulation structures according to the invention the "calcium test" has been used, as described in "Experimental comparison of high-performance water vapor permeation measurement methods", Nisato et. al., Organic Electronics 15 (2014), 3746-3755. Pure metallic calcium is an opaque material, which reacts with water to form transparent calcium hydroxide. If shielded by a barrier structure, the corrosion rate of a calcium thin-film is a measure of the water vapor transmission rate (WVTR) of the barrier structure. It can be determined by measuring the change of the optical transmission through the calcium thin-film from which the residual calcium thickness can be calculated. The tests regarding WVTR in the following examples have been made without the polarizer, which is part of the antireflective structure according to the invention. If the polarizer would influence the WVTR it would only decrease it as it is an additional layer of the encapsulation structure. Accordingly, an encapsulation structure including the polarizing layer would have improved WVTR properties compared to that of the examples below.

Preparation of the Solvent Free Radiation Curable Resin Composition RES1

A composition RES1 of polymerizable materials has been prepared following the recipe and the instruction of example F20 in table IId of WO2014012931, however without the CaO.

The composition RES1 consists of 51 wt % SR262, 9.6 wt % SR351, 21.1 wt % SR421a, 17.3 wt % SR307 and 1 wt % Irgacure 369. Details of the commercially available substances are listed in table 1 below. RES1 does not contain a solvent and is liquid at room temperature.

TABLE 1

| Trade Name | Supplier | Chemical Name | Structure |
|---|---|---|---|
| SR262 | Sartomer | C-12 alkyl dimethacrylate | $CH_2{=}C(CH_3){-}C({=}O){-}O{-}(CH_2)_{12}{-}O{-}C({=}O){-}C(CH_3){=}CH_2$ |
| SR351 | Sartomer | Trimethylolpropane-triacrylate | (structure) |
| SR421A | Sartomer | trimethyl cyclohexanol methacrylate | (structure) |
| SR307 | Sartomer | Poly(butadiene) diacrylate | (structure) |
| Irgacure 369 | BASF | 2-Benzyl-2-dimethylamino-1-(4-morpholinophenyl)-butanone-1 | (structure) |
| CaO | Aldrich | Calcium Oxide | |

Preparation of the Photo-Alignable Composition PAC1

A photoalignable composition PAC1 has been prepared by mixing 94.5 wt % RES1, 5 wt % photo-alignable substance PA1 and adding 0.5% calcium oxide (CaO) particles. The composition was stirred for 16 hours at room temperature. Composition PAC1 does not comprise a solvent.

The polymer PA1 has the following structure and has been prepared according to the description in WO2015024810A1.

Preparation of a Solution PAC2 comprising Photo-Alignable Material PA2

A solution PAC2 has been prepared by diluting 3 wt % of the photo-alignable polymer PA2 in 97 wt % of the solvent mixture 50 wt % butyl acetate/50 wt % ethyl acetate. The solution is then stirred at room temperature for 30 minutes.

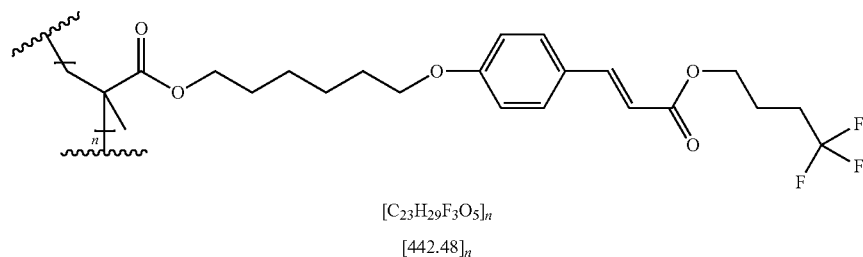

$[C_{23}H_{29}F_3O_5]_n$ $[442.48]_n$

Polymer PA2 has the following structure:

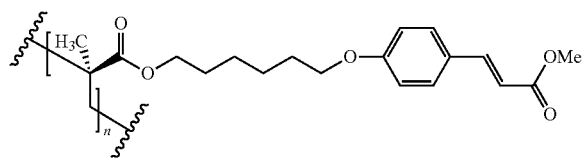

Preparation of the LCP Solution LCP1

25 wt % of a mixture consisting of 95.475 wt % Benzoic acid, 2,5-bis[[4-[[6-[(1-oxo-2-propenyl)oxy]hexyl]oxy] benzoyl]oxy]-, pentyl ester, 2 wt % Irgacure OXE02 (BASF), 0.5 wt % TEGO Flow 300 (Evonik), 0.025 wt % 2,6-di-tert-butyl-4-methylphenol (Sigma Aldrich) and 2 wt % Kayarad DPCA-20 (Nippon Kayaku) is dissolved in 75 wt % n-butyl acetate and stirred for 90 minutes at room temperature in order to receive the LCP solution LCP1. The solution is filtered through a 0.45 µm PTFE filter.

Preparation of a Ca-Test Substrate

A 100 nm thin layer of Silicon Nitride (SiN) is applied on top of a cleaned 15 cm×15 cm glass substrate (1.1 mm thickness) by Plasma Enhanced Chemical Vapor Deposition (PECVD) at 130° C. On top of the ceramic layer 9 groups of each 9 calcium squares are evaporated through a mask. Each of the 81 calcium squares has a lateral dimension of 5 mm×5 mm and a thickness of around 50 nm. The SiN layer below the Calcium does not contribute to the barrier properties of the barrier structure, which will be prepared above the calcium as described in the following.

Preparation of Encapsulation Structure ES1 on a Ca-Test Substrate

A 20 µm thick planarization layer of RES1 is ink-jet printed on a Ca-test substrate. The material is cured under inert atmosphere using a LED lamp at 395 nm and 4 J/cm2. After curing, a 150 nm inorganic SiN layer is deposited by PECVD at 130° C.

Then a layer of the photo-alignable substance PA2 is spincoated from the solution PAC2 at 1000 rpm for 30 sec+2000 rpm for 2 seconds and thermally cured at 80° C. for 4 minutes on a heating plate. The polymer is exposed to linearly polarized UV-B light at an energy of 60 mJ/cm$^2$, which causes photo-alignment in the PA2 layer. On top of the aligned PA2 layer a 1.3 µm thick LCP film is applied by spincoating the solution LCP1 at 1400 rpm for 30 seconds, and annealing on a hot-plate at 55° C. for 4 minutes. The temperature is then slowly decreased during 15 minutes down to room temperature and the LCP layer is cross-linked under nitrogen atmosphere by irradiating it with UV-A light with 1.5 J/cm$^2$.

On top of the LCP layer a 150 nm thick SiN layer is applied by PECVD. Finally, a 20 µm thick layer of RES1 is ink-jet printed on top of the SiN layer. The material is cured under inert atmosphere using a LED lamp at 395 nm and 4 J/cm2.

Figure 7:
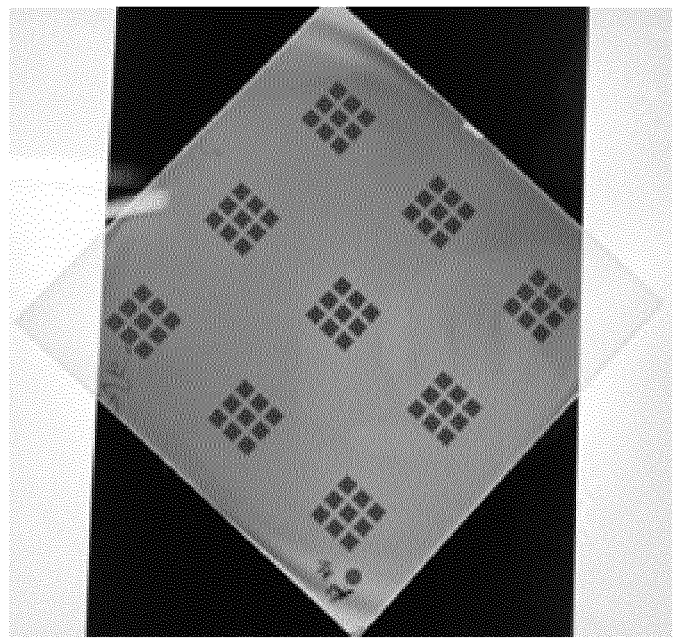
FIG. 7 shows a photograph of an encapsulation structure on a Ca-test substrate comprising 81 calcium squares.

FIG. 7 shows a photograph of the final encapsulation structure ES1 on the Ca-test substrate between crossed polarizers, with the induced alignment direction of the PA2 layer at 45° to the polarization direction of the polarizers. The area outside the glass is dark as the polarizers are crossed. Inside of the glass the 81 calcium squares appear dark as they are not transparent. The area of the glass which is not covered by calcium appears bright because of the birefringence of the LCP material which has been aligned by the PA2 layer. The optical retardation measured in this area with a tilting compensator is about 140 nm, which acts as a quarter wave retarder for green light.

Preparation of Encapsulation Structure ES2 on a Ca-Test Substrate

A 20 µm thick planarization layer of RES1 is ink-jet printed on a Ca-test substrate. The material is cured under inert atmosphere using a LED lamp at 395 nm and 4 J/cm$^2$. After curing, a 150 nm inorganic SiN layer is deposited by PECVD at 130° C.

Then a 20 µm thick layer of the photoalignable composition PAC1 is ink-jet printed on top of the SiN layer. The PAC1 layer is irradiated with light of 395 nm wavelength and an energy of 4 J/cm$^2$ to initiate polymerisation of the acrylic monomers. Then the PAC1 layer is exposed to linearly polarized UV-B light at an energy of 60 mJ/cm$^2$, which causes photo-alignment of the photo-alignable substance PA1 in the PAC1 layer.

On top of the aligned PAC1 layer a 1.3 µm thick LCP film is applied by spincoating the solution LCP1 at 1400 rpm for 30 seconds, and annealing on a hot-plate at 55° C. for 4 minutes. The temperature is then slowly decreased during 15 minutes down to room temperature and the LCP layer is cross-linked under nitrogen atmosphere by irradiating it with UV-A light with 1.5 J/cm$^2$.

On top of the LCP layer a 150 nm thick SiN layer is applied by PECVD. Finally, a 20 µm thick layer of RES1 is ink-jet printed on top of the SiN layer. The material is cured under inert atmosphere using a LED lamp at 395 nm and 4 J/cm$^2$.

When the final encapsulation structure ES2 on the Ca-test substrate is observed between crossed polarizers with the induced alignment direction of the PAC1 layer at 45° to the polarization direction of the polarizers, the glass appears bright, except of the 81 calcium squares, which appear dark as they are not transparent. The area of the glass which is not covered by calcium appears bright because of the birefringence of the LCP material which has been aligned by the PAC1 layer. The optical retardation measured in this area with a tilting compensator is about 140 nm.

Preparation of Encapsulation Structure ES3 on a Ca-Rest Substrate

A 20 µm thick planarization layer of RES1 is ink-jet printed on a Ca-test substrate. The material is cured under inert atmosphere using a LED lamp at 395 nm and 4 J/cm$^2$. After curing, a 150 nm inorganic SiN layer is deposited by PECVD at 130° C.

Then a layer of the photo-alignable substance PA2 is spincoated from the solution PAC2 at 1000 rpm for 30 sec+2000 rpm for 2 seconds and thermally cured at 80° C. for 4 minutes on a heating plate. The polymer is exposed to linearly polarized UV-B light at an energy of 60 mJ/cm$^2$, which causes photo-alignment in the PA2 layer. On top of the aligned PA2 layer a 1.3 µm thick LCP film is applied by spincoating the solution LCP1 at 1400 rpm for 30 seconds, and annealing on a hot-plate at 55° C. for 4 minutes. The temperature is then slowly decreased during 15 minutes down to room temperature and the LCP layer is cross-linked under nitrogen atmosphere by irradiating it with UV-A light with 1.5 J/cm$^2$.

When the final encapsulation structure ES3 on the Ca-test substrate is observed between crossed polarizers with the induced alignment direction of the PA2 layer at 45° to the polarization direction of the polarizers, the glass appears bright, except of the 81 calcium squares, which appear dark as they are not transparent. The area of the glass which is not covered by calcium appears bright because of the birefringence of the LCP material which has been aligned by the PA2 layer. The optical retardation measured in this area with a tilting compensator is about 140 nm.

Evaluation of the WVTR Performance of the Encapsulation Structures ES1, ES2 and ES3

Figure 8A:
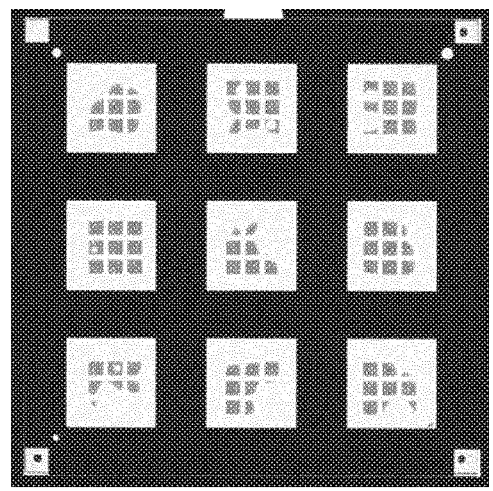
FIGS. 8A, 8B and 8C shows photographs of three different encapsulation structure on Ca-test substrates after storing at 60° C. and 90% rel. humidity for 885 hours.
Figure 8B:
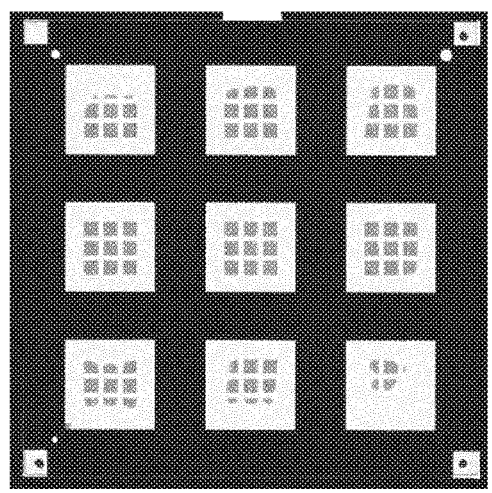
Figure 8C:
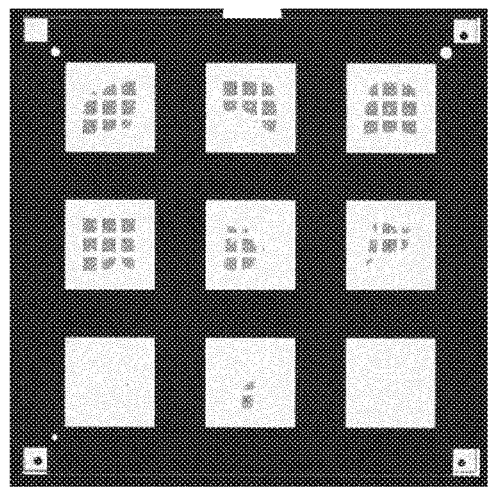

The encapsulation structures ES1, ES2 and ES3 on the Ca-test substrates were stored in a climate chamber at 60° C. and 90% relative humidity for 885 hours. The appearance of the test substrates is shown in the photographs in FIG. 8, where FIG. 8*a* shows the substrate with structure ES1, FIG. 8*b* shows the substrate with structure ES2 and FIG. 8*c* shows the substrate with structure ES3. On each of the substrates some of the calcium squares have been fully or partially disappeared. According to the explanation in Nisato et. al., this happens because of permeation of water through pinholes and defects. The disappearance of Ca area is therefore a measure of the so called extrinsic WVTR. On the other hand, the intrinsic WVTR is determined from measurements of transmission changes in the defect free parts of the calcium squares. The intrinsic WVTR is therefore the characteristic value for a certain encapsulation structure for the best case that there are no pinholes or defects in the structure.

As a measure for the extrinsic WVTR the total of the remaining calcium areas on each substrate has been determined, which is summarized in the table below:

| Encapsulation structure | Remaining calcium area |
| --- | --- |
| ES1 | 74.3% |
| ES2 | 79.1% |
| ES3 | 46.7% |

The extrinsic WVTR of encapsulation structure ES2 is slightly better than that of ES1. Both ES1 and ES2 show improved extrinsic WVTR compared with ES3, which is most probably due to the additional inorganic SiN layer of ES1 and ES2.

The intrinsic WVTR has been determined from the average transmission change within the defect free calcium parts. The results are listed below:

| Encapsulation structure | Intrinsic WVTR [g/m$^2$/day] |
| --- | --- |
| ES1 | $2.5 \times 10^{-5}$ |
| ES2 | $3.7 \times 10^{-5}$ |
| ES3 | $2.1 \times 10^{-5}$ |

The values of the intrinsic WVTR are very close to each other and may be considered as identical within the measurement uncertainty. Accordingly each of the encapsulation structures ES1, ES2 and ES3 according to the invention has superior intrinsic WVTR. Obviously, the additional inorganic SiN layer in structures ES1 and ES2 does not further improve the intrinsic WVTR.

The invention claimed is:

1. An encapsulation structure with antireflection properties for an organic light emitting diode (OLED) display having a top surface and a bottom surface, the encapsulation structure comprising a linearly polarizing layer (6), an inorganic layer (3), a layer comprising a photo-aligned substance (4), and a liquid crystal polymer layer (5) layered for arrangement, in no particular order relative to each other, on the top surface of the OLED display, wherein a liquid crystal orientation in the liquid crystal polymer layer has been created due to contact with the photo-aligned substance and wherein the layer (4) comprising the photo-aligned substance comprises one or more substances, which are polymerizable but not photo-alignable, wherein the concentration of the in the layer (4) is higher at the side, which is in contact with the liquid crystal polymer layer (5), than in the bulk of the layer (4), and wherein a concentration of the one or more substances in the layer (4) is greater than 70 percent of a sum of the weight of the photo-aligned substance and the one or more substances in the layer (4).

2. The encapsulation structure according to claim 1, wherein the photo-aligned substance and at least one substance, which is not photo-alignable, are phase separated in the layer (4) comprising a photo-aligned substance.

3. The encapsulation structure according to claim 1, wherein the linearly polarizing layer (6) comprises a polymerized liquid crystal material and dichroic dyes.

4. The encapsulation structure according to claim 3, wherein the linearly polarizing layer (6) further comprises a getter material.

5. The encapsulation structure according to claim 1, wherein the total thickness of the encapsulation structure is less than 50 μm.

6. The encapsulation structure according to claim 1, wherein the layer (4) comprising a photo-aligned substance further comprises a getter material.

7. The encapsulation structure according to claim 1, wherein the liquid crystal polymer layer (5) has an orientation pattern.

8. An OLED display encapsulated by the encapsulation structure of claim 1.

9. A material composition for use in the production of the encapsulation structure according to claim 1, wherein the material composition comprises a photo-alignable substance and one or more substances, which are neither photo-alignable nor a solvent.

10. The material composition according to claim 9, further comprising a getter material.

11. The material composition according to claim 9, characterized that it includes no solvents and can be deposited on a substrate in the form of a layer by known coating or printing methods.

12. The material composition according to claim 9, wherein the material composition is solvent-free.

13. The encapsulation structure according to claim 1, wherein the photo-aligned substance in layer (4) comprises fluorinated moieties.

14. The encapsulation structure according to claim 1, wherein the photo-aligned substance in layer (4) comprises siloxane moieties.

15. The encapsulation structure according to claim 1, wherein the photo-aligned substance in layer (4) is a polysiloxane.

16. The encapsulation structure according to claim 1, wherein the thickness of the layer (4) comprising a photo-aligned substance is larger than 500 nm.

17. The encapsulation structure according to claim 1, wherein the layer (4) comprising a photo-aligned substance further comprises aligned LCP molecules.

18. The encapsulation structure according to claim 1, wherein the liquid crystal polymer layer (5) comprises a getter material.

19. A method for manufacturing an encapsulated OLED display incorporating anti-reflection properties, comprising the steps of generating an OLED display device having a top surface and a bottom surface encapsulating the organic light emitting diode (OLED) display device with an encapsulation structure, which provides antireflective properties, the structure including an inorganic layer (3), a layer comprising a photo-aligned substance (4), a liquid crystal polymer layer (5) in contact with the layer comprising a photo-aligned substance, and a linear polarizing layer (6) layered for arrangement on the top surface of the OLED display device, such that the liquid crystal polymer layer (5) is between the OLED display device and the polarizing layer (6), wherein the layer (4) comprising the photo-aligned substance comprises one or more substances, which are polymerizable but not photo-alignable, wherein the concentration of the photo-aligned substance in the layer (4) is higher at the side, which is in contact with the liquid crystal polymer layer (5), than in the bulk of the layer (4), and wherein a concentration of the one or more substances in the layer (4) is greater than 70 percent of a sum of the weight of the photo-aligned substance and the one or more substances in the layer (4).

20. The method according to claim 19, wherein the encapsulation structure is manufactured on a separate substrate and subsequently applied to the OLED display device.

21. The method according to claim 20, wherein the separate substrate is a polarizing foil.

22. An encapsulation structure with antireflection properties for an organic light emitting diode (OLED) display, comprising an inorganic layer (3), a layer comprising a photo-aligned substance (4), a liquid crystal polymer layer (5), and a linearly polarizing layer (6) layered in one of a first sequence or a second sequence on one side of the OLED display, wherein the first sequence is defined by the layer (3), the layer (4), the layer (5), and the layer (6) being layered sequentially, wherein the second sequence is defined by the layer (3), the layer (5), the layer (4), and the layer (6) being layered sequentially, wherein a liquid crystal orientation in the liquid crystal polymer layer has been created due to contact with the photo-aligned substance and wherein the layer (4) comprising the photo-aligned substance comprises one or more substances, which are polymerizable but not photo-alignable, wherein the concentration of the photo-aligned substance in the layer (4) is higher at the side, which is in contact with the liquid crystal polymer layer (5), than in the bulk of the layer (4), wherein the inorganic layer (3) is not a glass substrate.

23. The encapsulation structure according to claim 22, wherein the photo-aligned substance and at least one substance, which is not photo-alignable, are phase separated in the layer (4) comprising a photo-aligned substance.

24. The encapsulation structure according to claim 22, wherein the linearly polarizing layer (6) comprises a polymerized liquid crystal material and dichroic dyes.

25. The encapsulation structure according to claim 24, wherein the linearly polarizing layer (6) further comprises a getter material.

26. The encapsulation structure according to claim 22, wherein the total thickness of the encapsulation structure is less than 50 μm.

27. The encapsulation structure according to claim 22, wherein the layer (4) comprising a photo-aligned substance further comprises a getter material.

28. The encapsulation structure according to claim 22, wherein the liquid crystal polymer layer (5) has an orientation pattern.

29. An OLED display encapsulated by the encapsulation structure of claim 22.

30. A material composition for use in the production of the encapsulation structure according to claim 22, wherein the material composition comprises a photo-alignable substance and one or more substances, which are neither photo-alignable nor a solvent.

31. The material composition according to claim 30, further comprising a getter material.

32. The material composition according to claim 30, characterized that it includes no solvents and can be deposited on a substrate in the form of a layer by known coating or printing methods.

33. The encapsulation structure according to claim 22, wherein the photo-aligned substance in layer (4) comprises fluorinated moieties.

34. The encapsulation structure according to claim 22, wherein the photo-aligned substance in layer (4) comprises siloxane moieties.

35. The encapsulation structure according to claim 22, wherein the photo-aligned substance in layer (4) is a polysiloxane.

36. The encapsulation structure according to claim 22, wherein the thickness of the layer (4) comprising a photo-aligned substance is larger than 500 nm.

37. The encapsulation structure according to claim 22, wherein the layer (4) comprising a photo-aligned substance further comprises aligned LCP molecules.

38. The encapsulation structure according to claim 22, wherein the liquid crystal polymer layer (5) comprises a getter material.

39. A method for manufacturing an encapsulated organic light emitting diode (OLED) display incorporating antireflection properties, comprising the steps of generating an OLED display device on a substrate encapsulating the OLED display device with an encapsulation structure, which provides antireflective properties, the structure including an inorganic layer (3), a layer comprising a photo-aligned substance (4), a liquid crystal polymer layer (5) in contact with the layer comprising a photo-aligned substance, and a linear polarizing layer (6) layered in one of a first sequence or a second sequence on one side of the OLED display, such that the liquid crystal polymer layer (5) is between the OLED display device and the polarizing layer (6), wherein the first sequence is defined by the layer (3), the layer (4), the layer (5), and the layer (6) being layered sequentially, wherein the second sequence is defined by the layer (3), the layer (5), the layer (4), and the layer (6) being layered sequentially wherein the layer (4) comprising the photo-aligned substance comprises one or more substances, which are polymerizable but not photo-alignable, wherein the concentration of the photo-aligned substance in the layer (4) is higher at the side, which is in contact with the liquid crystal polymer layer (5), than in the bulk of the layer (4), wherein the inorganic layer (3) is not a glass substrate.

40. The encapsulation structure according to claim 22, wherein the inorganic layer (3) is closer to the OLED display than the other layers.

41. The method according to claim 39, wherein the encapsulation structure is manufactured on a separate substrate and subsequently applied to the OLED display device.

42. The method according to claim 41, wherein the separate substrate is a polarizing foil.

43. The method according to claim 41, wherein the inorganic layer (3) is closer to the OLED display than the other layers.

* * * * *